(12) United States Patent
Liu et al.

(10) Patent No.: US 6,366,123 B1
(45) Date of Patent: Apr. 2, 2002

(54) INPUT BUFFER CIRCUIT FOR LOW POWER APPLICATION

(75) Inventors: Shi Huei Liu, Taipei; Jeng Tzong Shih, Hsinchu, both of (TW)

(73) Assignee: Etron Technology, Inc., Hsin-chu (TW)

( * ) Notice: Subject to any disclaimer, the term of this patent is extended or adjusted under 35 U.S.C. 154(b) by 0 days.

(21) Appl. No.: 09/775,944

(22) Filed: Feb. 5, 2001

(51) Int. Cl.[7] .................... H03K 19/0175; H03K 17/16
(52) U.S. Cl. .......................... 326/58; 326/57; 326/56; 326/86; 327/108; 365/230.08
(58) Field of Search ................ 326/56–58, 86; 327/108; 365/230.08, 233, 230.01

(56) References Cited

U.S. PATENT DOCUMENTS

| | | | |
|---|---|---|---|
| 3,984,703 A | 10/1976 | Jorgensen | 307/279 |
| 5,450,019 A | 9/1995 | McClure et al. | 326/28 |
| 5,633,833 A * | 5/1997 | Yoon | 365/230.08 |
| 5,680,065 A * | 10/1997 | Park | 326/86 |
| 5,767,696 A * | 6/1998 | Choi | 326/56 |
| 6,005,412 A | 12/1999 | Ranjan et al. | 326/63 |

* cited by examiner

Primary Examiner—Michael Tokar
Assistant Examiner—Vibol Tan
(74) Attorney, Agent, or Firm—George O. Saile; Stephen B. Ackerman

(57) ABSTRACT

An input buffer receiver is described that will latch on a particular transition to insure a single transition does not have multiple transitions due to disturbances. This is accomplished with a Schmitt Trigger and a feedback latch controlled by an enabling signal. In one application, this is a chip select. A chip addressing input to a Schmitt Trigger type tri-state buffer is applied in parallel to two gates of the plurality of stacked CMOS transistors. A chip selection (CSB) signal is applied to a first gate of the Schmitt Trigger type tri-state buffer and in parallel to a second gate through an inverter. The output of the tri-state buffer is then fed to a latch circuit comprised of a plurality of stacked CMOS transistors. The latch output is the signal that goes to the circuitry that selects the desired chip address. The latch output is fed back into the appropriate gates of the latch to effect the desired latch-up when the Schmitt Trigger is put into the high output impedance state. The latchup during this hi-Z state prevents the latch output from changing whenever the chip addressing input to the Schmitt Trigger changes due to circuit disturbances. The latchup also prevents reconfiguration of down stream circuitry when selection is not done, thus minimizing the use of power. The tri-state capability uses an hysteresis effect to produce higher trip points when the Schmitt Trigger is not in the hi-Z mode and the input switches low, and lower trip points when the trigger switches high thus eliminating unwanted circuit noise effects.

6 Claims, 4 Drawing Sheets

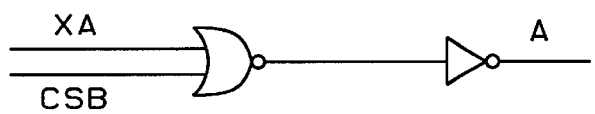
*FIG. 1 - Prior Art*
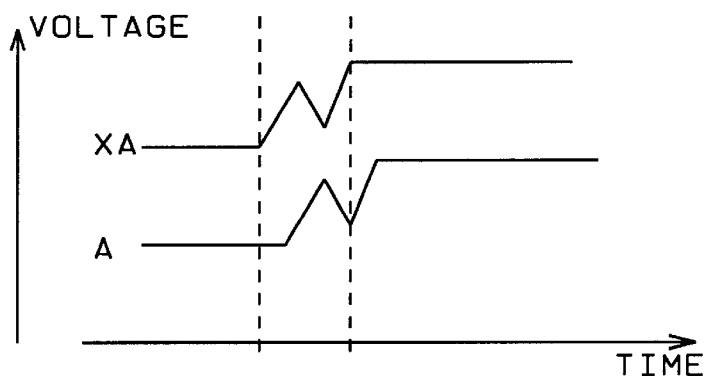
*FIG. 2 - Prior Art*
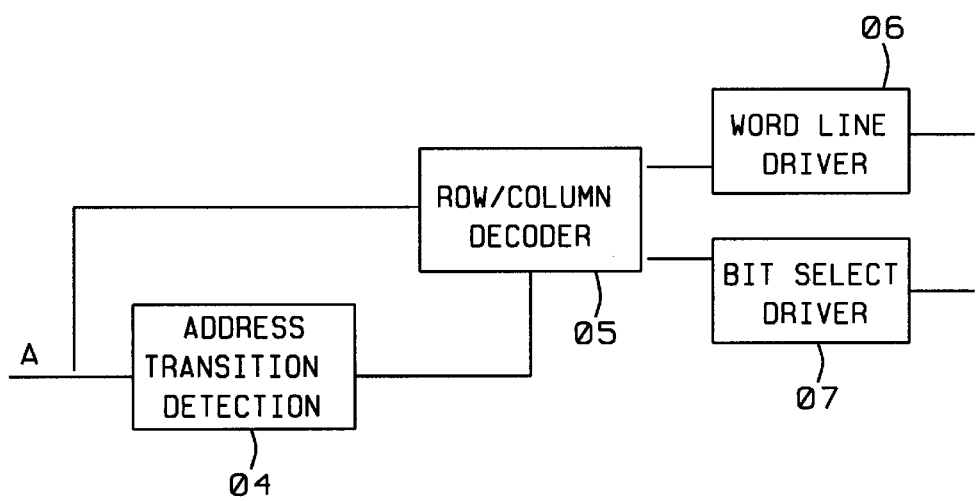
*FIG. 3*

| CSB | XA | OUT |
|-----|----|----|
| 0 | 1 | 0 |
| 0 | 0 | 1 |
| 1 | 0 | HiZ |
| 1 | 1 | HiZ |

*FIG. 7*

INPUT BUFFER CIRCUIT FOR LOW POWER APPLICATION

BACKGROUND OF THE INVENTION

1. Field of Invention

The present invention relates in general to complementary MOS (CMOS) circuits to provide low power buffer capability, and more particularly to a CMOS Schmitt trigger with a tri-state feature and a latching circuit.

2. Description of Related Art

Buffer circuits are an integral element in many memory-oriented applications; however, previous applications of the buffer circuits have often resulted in higher power use than necessary. In addition, the previous applications have been subject to multiple transitions of state, when only one transition is desired.

U.S. Pat. No. 3,984,703 (Jorgensen) describes a classic CMOS Schmitt trigger circuit of the prior art. Jorgensen describes an improvement that addresses both high power drain and uneconomical use of die space.

U.S. Pat. No. 5,450,019 (McClure, et al.) describes the use of Schmitt triggers to control a precharge circuit to terminate when the output terminal has reached an intermediate voltage, so that oscillations are minimized as a result of the hysteresis characteristic. Connection of the output terminal to a gate of a precharging driver transistor helps to eliminate overshoot during precharge.

U.S. Pat. No. 6,005,412 (Ranjan, et al.) describes an I/O interface that includes latches, clocks, and conditioning circuits implemented in a custom physical layout to produce a reliable and flexible interface to high frequency busses running a plurality of protocols and signal specifications.

One of the problems with the prior art is the high power dissipation used in the memory applications. Another problem is the possibility of multiple transitions when a Schmitt trigger changes state, due to disturbances in the circuitry.

SUMMARY OF THE INVENTION

An object of the invention is to significantly decrease power dissipation while the circuit is in standby mode.

A further object is to significantly decrease the sensitivity of the circuitry to external disturbances.

A further object is to utilize a tri-state input buffer and feedback latch to accomplish the first objective.

A further object is to utilize the hysteresis effect found in Schmitt Triggers to accomplish the second objective.

The objects are achieved by use of an input buffer receiver with a feedback latch. The latch is activated on a particular transition to insure that a single transition at the input does not result in multiple transitions at the output due to circuit disturbances. This feature is accomplished with a Schmitt trigger and a feedback latch controlled by an enabling signal. Lower power dissipation for an input buffer receiver is another feature of this invention.

In the invention, a traditional input buffer is replaced by a Schmitt trigger type tri-state buffer. The output of the traditional input buffer is subject to noisy input wave shapes. The output of the Schmitt Trigger feeds a feedback latch, which in turn drives the corresponding memory address line A. Because of the combination of the Schmitt trigger and the feedback latch, the output A will be less responsive to circuit disturbances on XA while the chip is selected (CSB is at "0"). This desirable effect is due to the hysteresis in the voltage transfer characteristics of a Schmitt trigger when changing state in either direction.

In addition, A will maintain its current value when CSB is "1," effectively deselecting the chip, i.e. changes on XA, will not be passed on to the output A while the chip is deselected. Thus, the circuitry driven by A, is in a standby mode while XA may be changing in value due to various causes. This constancy of A results in less power dissipation in the associated driven circuitry.

BRIEF DESCRIPTION OF THE DRAWINGS

This invention will be described with reference to the accompanying drawings, wherein:

FIG. 1 is a circuit diagram of a traditional input buffer of prior art.

FIG. 2 depicts the possible output wave shape from a traditional input buffer under conditions of a noisy input to the circuit;

FIG. 3 is a block diagram of the circuitry to be driven by the input buffer or by the Schmitt trigger type tri-state buffer with feedback latch (the invention);

FIG. 7 is a table describing the relationship between the inputs (XA, CSB) and output (OUT) of the Schmitt Trigger type tri-state buffer.

DETAILED DESCRIPTION OF THE PREFERRED EMBODIMENT

FIG. 1 shows a simple traditional input buffer of the prior art that can be used to drive the address circuitry (FIG. 3) in a memory application. The address, represented by XA is passed through the input buffer to A if Chip Select, CSB is set to "0." If the chip is deselected by CSB being set to "1," the value on A maintains its current value determined just before CSB changed to "1." When the chip is selected by CSB="0," any noise on the XA line is passed through to the A address line, and could effect the addressing scheme, possibly causing errors. FIG. 2 shows a possible output wave shape at A when a noisy input on XA occurs while the chip is selected (CSB="0"). The Address Translation Detection function 04, shown in FIG. 3, may interpret the multiple noisy transitions of A, in FIG. 2, to be multiple address transitions, causing the Decoder 05 to attempt to decode A. In addition, the fact that A changes value to a "1" upon chip de-selection wastes power in the circuitry driven by the wordline driver 06 and the bit select driver 07.

Figure 4:
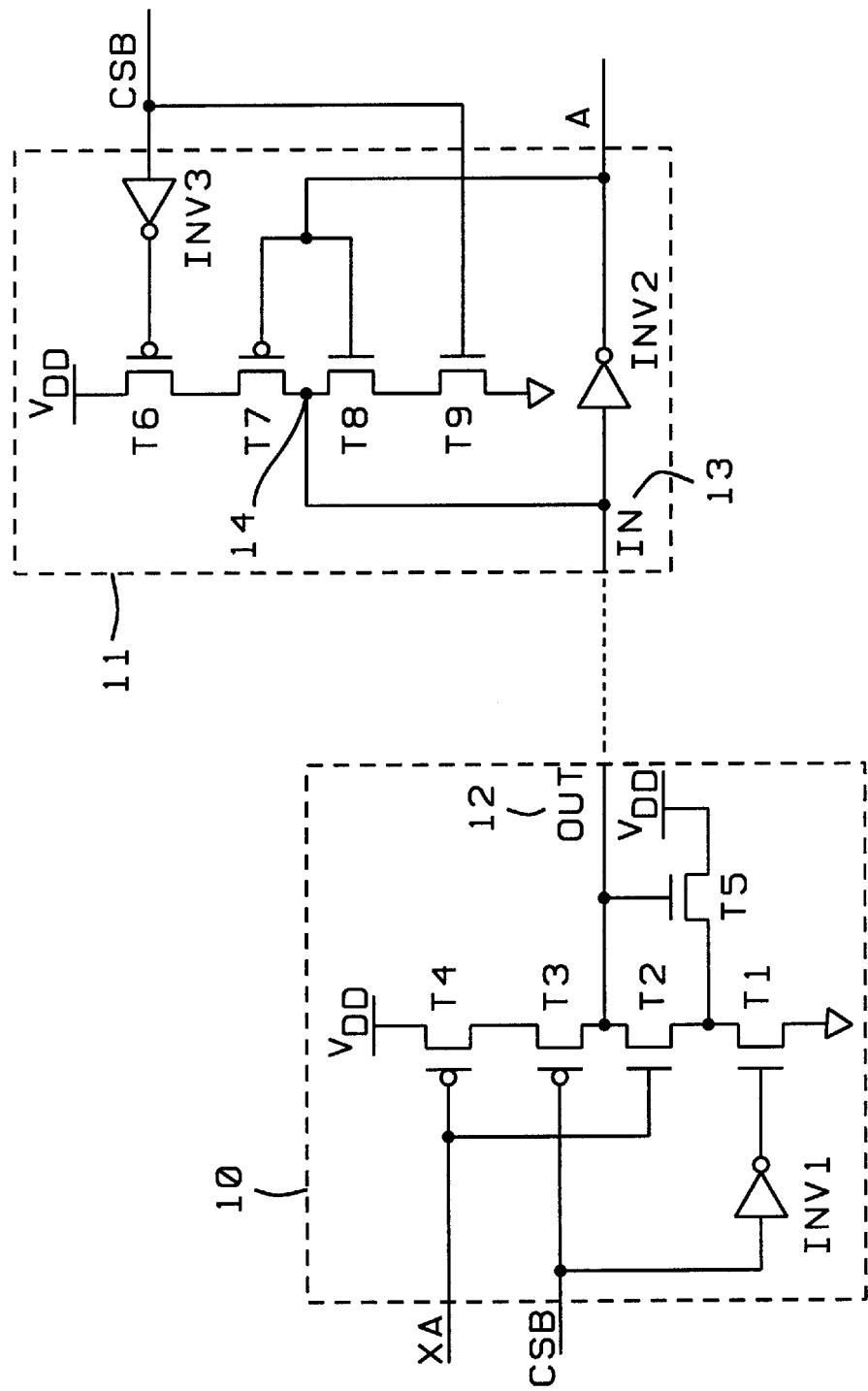
FIG. 4 is the preferred embodiment of the invention, comprised of the Schmitt trigger type tri-state buffer, and the feedback latch.

This situation is alleviated by the method of the invention, which replaces the traditional input buffer with a Schmitt trigger type tri-state buffer with a feedback latch, as shown in FIG. 4. In FIG. 4, the OUT line 12 of the Schmitt trigger type tri-state buffer 10 connects to the IN line 13 of the feedback latch 11. The latch 11 is held at its present state when the CSB input goes to a "1," deselecting the chip and keeping the output A at its present value, regardless of future values of XA while CSB is "1." The address output A may only change when CSB again goes to a "0" value, thereby selecting the chip once again, and allowing the value on XA to be transferred to A. While CSB="0," the feedback latch 11 has no control over the value on A.

Figure 5:
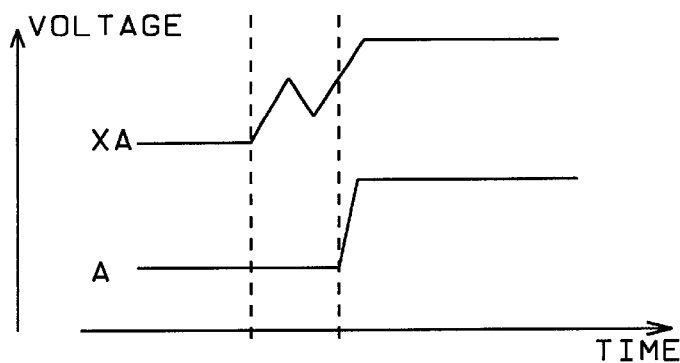
FIG. 5 depicts the output wave shape of the Schmitt trigger type tri-state buffer of the invention.
Figure 6A:
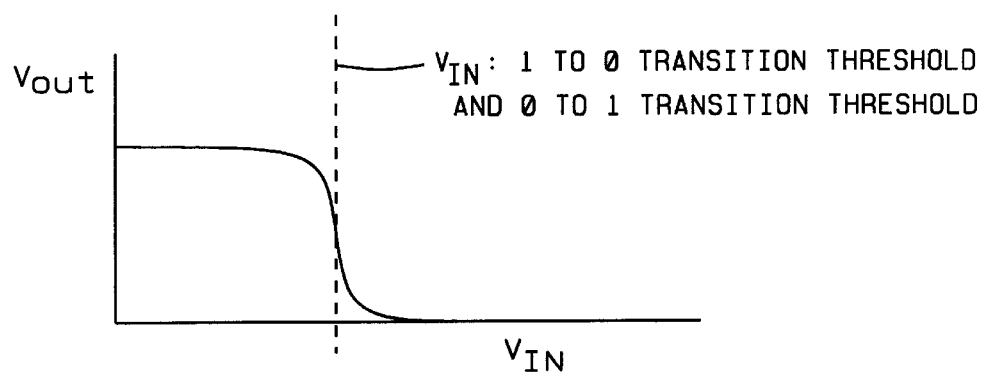
FIGS. 6a and b is a voltage transfer function graph illustrating the hysteresis effect of a Schmitt trigger type tri-state buffer of the invention.
Figure 6B:
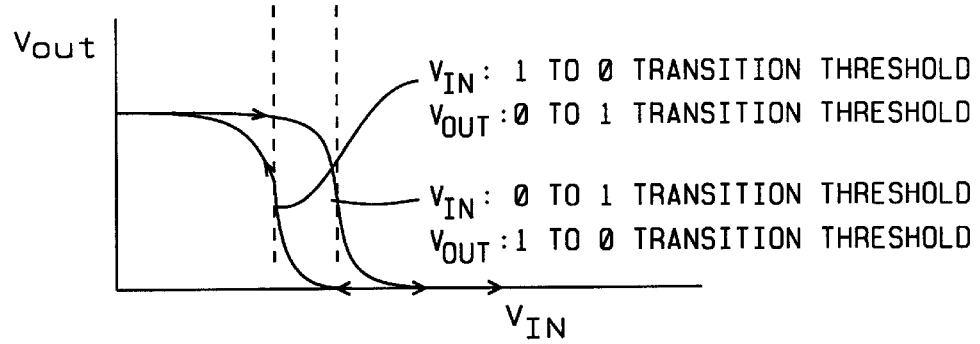

FIG. 5 illustrates an additional value of the invention resulting from the hysteresis effect found in the Schmitt trigger 10. When the chip is selected by CSB going to "0," the trigger 10 will be insensitive to noise disturbances on the XA input below the trigger threshold switching voltage. FIG. 5 shows a noisy XA input and a clean change of value on the A output. FIG. 6b illustrates the Schmitt trigger voltage transfer function in contrast to the typical inverter voltage transfer function shown in FIG. 6a. As seen in FIG. 6b, when $V_{in}$ goes to "0" (representing XA going to "0") $V_{out}$ goes to "1" (representing OUT going to "1") at a threshold that is high enough to reject a significant noise level at the input XA. Similarly, because of the hysteresis effect in the Schmitt trigger, when $V_{in}$ goes to "1" (representing XA going to "1") $V_{out}$ goes to "0" (representing OUT going to "0") the reverse change threshold is again sufficiently high as to reject noise in this direction of switching as well. In other words, when switching the output from "0" to "1'," the lower $V_{in}$ threshold (FIG. 6b) is in effect. When switching the output from "1" to "0," the upper $V_{in}$ threshold is in effect. The trigger circuit can be designed to make use of the hysteresis effect as documented in the literature.

Figure 7:
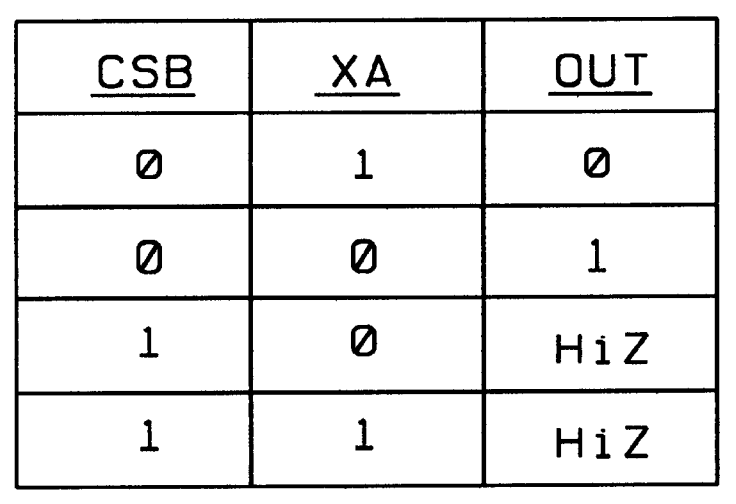

The Schmitt trigger type tri-state buffer circuitry in FIG. 4 is composed of two nFET (T1 and T2) transistors and two pFET transisistors (T3 and T4) in tandem, an additional nFET (T5) acting as a pass transistor, connected to the output of T1 and T2, and an inverter circuit (INV1).The Feedback Latch Circuitry shown in FIG. 4 is composed of two nFET (T8 and T9) transistors and two pFET (T6 and T7) transistors in tandem, and two inverter circuits (INV2 and INV3). In FIG. 7 is shown operating states of the Schmitt trigger type tri-state buffer 10. The CSB acts as a control, to allow (when CSB=0) or to prevent (when CBS=1), the passage of the value of XA to the output A of the feedback latch 11. An nFET passes a strong logic "0" (positive logic assumed), while a pFET passes a strong logic "1." When CSB has a value of "0," the tandem arrangement of the pFET train (T3 and T4 shown in FIG. 4) provides a path for XA to pass through a strong "1" when XA has a value of "0." When CSB has a value of "0," the tandem arrangement of the nFET train (T1 and T2) provides a path for XA to pass through a strong "0" when XA has a value of "1."

Continuing to refer to FIGS. 4 and 7, when CSB=0 and XA=1, the value of CSB is inverted by Inverter INV1, so that the inverse signal appears at the Gate of nFET T1 . The "1" level at the Gate makes nFET T1 active and current may flow. CSB directly feeds the pFET T3 with a "0" level, making T3 active. Since XA=1, the Gate of T2 is biased to make T2 also active. However, XA feeds the Gate of the pFET T4 with a "1" level causing T4 to be inactive. The OUT signal 12 from the Schmitt Trigger 10 is thus determined by nFET T5, which provides the current from $V_{DD}$, through T5 to ground. The Gate of T5 will stabilize at "0" confirming that T5 is active. For all XA, OUT 12 is the inverse of XA when CSB=0, and when CSB=0 and XA=1, then OUT=0.

Continuing to refer to FIGS. 4 and 7, consider the case where CSB=0 and XA=0. The value of CSB is inverted by Inverter INV1, so that a "1" appears at the Gate of nFET T1. The "1" level at the Gate makes nFET T1 active, and current may flow. CSB directly feeds the pFET T3 with a "0" level, making T3 active. Since XA=0, the Gate of nFET T2 is biased to make T2 inactive. However, XA feeds the Gate of the pFET T4 with a 0 level causing T4 to be active. The OUT signal 12 from the Schmitt Trigger is thus determined by nFET T5, which is inactive because the current from $V_{DD}$ passes through the active T4 and T3. Thus, OUT 12 is at the "1" level. The Gate of T5 will stabilize at "1" confirming that T5 is inactive. Again, for all XA, OUT is the inverse of XA when CSB=0. In this case OUT=1.

Continue to refer to FIGS. 4 and 7, when CSB=1, the OUT line 12 of the Schmitt trigger is placed in a high Z state, and the value of XA has no effect on OUT 12. This can be seen from the following analysis. When CSB=1, T3 and T1 are caused to be inactive. If XA=0, T4 becomes active, but current flow is blocked by T3. Likewise, if XA=0, T2 would become active, if T1 were active, but T1 is not active. Current flow is blocked by T1. When XA=1 while CSB=1. T1 and T3 are still inactive. T4 becomes inactive, and T2 would become active were it not for T1 being inactive. Thus, the OUT line 12 of the Schmitt trigger 10 is in a high impedance state. Note that the condition of the gate of T5, in the High Z case, will be determined by the value on the IN line 13 of the feedback latch 11, which will come from the drain to source connection 14 between T7 and T8. When CSB goes to a "1," the value on IN 13 is latched at its value at the time of the transition of CSB from "0" to "1."

Continuing to refer to FIGS. 4 and 7, When CSB=0, T9 and T6 are inactive, and the Schmitt Trigger OUT line 12 will control the value on the IN line 13. The value on A through inverter INV2 will also be controlled by the OUT line 12, and A will follow the value of XA while CSB remains at "0." When CSB goes to "1," the OUT line 12 goes to High Z. CSB=1 causes nFET T9 to be made active, and T6 is made active by means of the input to the Gate to T6, through the inverter INV3. If A had previously been a "1" (while CSB was at the "0" level) pFET T7 would have been inactive, and nFET T8 would have been active. Thus, the connection between T7 and T8 (14) is latched at the "0" level because of the current flow via T8 and T9. The "0" level is available and latched on the IN line 13. Therefore, A is latched to "1." If A had previously been a "0" (while CSB was at the "0" level) pFET T7 would have been active, and nFET T8 would have been inactive. Thus, the connection between T7 and T8 (14) is latched at the "1" level because of the current flow via T6 and T7. The "1" level is available and latched on the IN line 13. Therefore, A is latched to "0." When CSB again goes to "0," the value on the OUT line 12 is again controlled by XA and the Schmitt Trigger type tri-state buffer 10. XA will then control the latch so that A will follow XA While the invention has been particularly shown and described with reference to preferred embodiments thereof, it will be understood by those skilled in the art that various changes in form and details may be made without departing from the spirit and scope of the invention.

What is claimed is:

1. An Input Buffer Circuit, comprising:
    a Schmitt trigger type tri-state buffer, having first and second inputs and an output; and
    a feedback latch connected to the output of said Schmitt trigger type tri-state buffer, wherein the output of said Schmitt trigger type tri-state buffer maintains a high impedance state when said second input is in a deselect state, causing the output of the feedback latch to remain constant in its current state, and wherein said output of said feedback latch follows the level of the first input when said second input of the Schmitt trigger type tri-state buffer is in a select state.

2. The input buffer circuit of claim 1, wherein said Schmitt trigger type tri-state buffer comprises:
    two pFET transistors and two nFET transistors in tandem, which act as a means of buffering and gating the input signal level, and an additional nFET connected in such a way to act as a pass transistor to provide the high impedance to isolate from the feedback latch the output of the Schmitt trigger type tri-state buffer under the disabling condition, and an inverter to provide the correct level of the second input to the nFET transistor train.

3. The input buffer circuit of claim 1, wherein said feedback latch comprises;

two pFET transistors and two nFET transistors in tandem, connected as a latch, which takes at two inputs, the output of the Schmitt trigger buffer circuit, wherein one connection is via an inverter circuit to the gate of one of the pFET transistors, and the other connection is directly to the gate of one of the nFET transistors, and wherein the output at the junction of the tandem nFET and pFET trains is fed back via an inverter circuit as an input to the gates of the same pFET/nFET pair, thus forming the latch, and wherein the output of the junction of the tandem nFET and pFET trains is connected to the input of the latch, which is also connected to the output of the Schmitt trigger type tri-state buffer.

4. A method of buffering an input signal, comprising the steps of:

providing a Schmitt trigger type tri-state buffer, having a first and a second input and an output;

providing a feedback latch connected to the output of said Schmitt trigger type tri-state buffer;

maintaining a high impedance state at an output of said Schmitt trigger type tri-state buffer when said second input is in a deselect state, causing an output or the feedback latch to remain constant in its current state; and letting said output of said feedback latch follow the level of the first input when said second input of the Schmitt trigger type tri-state buffer is in a select state.

5. The method of claim 4, wherein the Schmitt trigger type tri-state buffer provides a buffering action that passes the input signal level at the first input of the Schmitt trigger tri-state buffer to its output only when enabled by an enabling level set at its second input, and otherwise provides a high impedance at its output, effectively isolating the feedback latch from the input to the Schmitt trigger type tri-state buffer.

6. The method of claim 4, wherein the feedback latch allows the output of the feedback latch to follow the signal level at the output of the Schmitt trigger tri-state buffer while the second input to the Schmitt trigger type tri-state buffer is enabled, and otherwise latches its output to the current state while the Schmitt trigger type tri-state buffer is disabled by a signal level set at its second input.

* * * * *